(12) United States Patent
Kanno et al.

(10) Patent No.: US 6,199,567 B1
(45) Date of Patent: Mar. 13, 2001

(54) METHOD AND APPARATUS FOR MANUFACTURING SEMICONDUCTOR DEVICE

(75) Inventors: Itaru Kanno, Hyogo; Tetsuo Aoyama; Mayumi Hada, both of Niigata, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/772,632

(22) Filed: Dec. 23, 1996

(30) Foreign Application Priority Data

Jun. 3, 1996 (JP) .................................................. 8-140039

(51) Int. Cl.$^7$ ...................................................... B08B 3/10
(52) U.S. Cl. .......................................... 134/184; 134/902
(58) Field of Search ................................... 134/184, 137, 134/902, 1, 1.3, 201; 310/335

(56) References Cited

U.S. PATENT DOCUMENTS

| | | | |
|---|---|---|---|
| 3,873,071 | * | 3/1975 | Tatebe .................................. 134/184 |
| 4,167,424 | * | 9/1979 | Jubenville et al. ................... 134/184 |
| 4,736,759 | * | 4/1988 | Coberly et al. ......................... 134/66 |
| 5,038,808 | * | 8/1991 | Hammond et al. ................... 134/184 |
| 5,159,945 | * | 11/1992 | Bannon ................................. 134/85 |
| 5,289,838 | * | 3/1994 | Odell ................................... 134/184 |
| 5,533,540 | * | 7/1996 | Stanasolovich et al. ............. 134/155 |
| 5,762,084 | * | 6/1998 | Krusell et al. ....................... 134/184 |

FOREIGN PATENT DOCUMENTS 7-130702  5/1995 (JP) .
7-221070  8/1995 (JP) .

* cited by examiner

Primary Examiner—Frankie L. Stinson
(74) Attorney, Agent, or Firm—McDermott, Will & Emery (57) ABSTRACT

In a method of manufacturing a semiconductor device including a capacitor, a refractory metal layer is dry-etched using a resist pattern as a mask, whereby a first electrode pattern formed of refractory metal is provided. Sidewall of the first electrode pattern is cleaned using aqueous solution of a surface active agent. Through this procedure, etching residue formed on the sidewall of the electrode pattern is removed when the electrode pattern of refractory metal is produced through dry etching method.

8 Claims, 11 Drawing Sheets

METHOD AND APPARATUS FOR MANUFACTURING SEMICONDUCTOR DEVICE

BACKGROUND OF THE INVENTION

1. Field of the Invention

The present invention generally relates to a method of manufacturing a semiconductor device, and more particularly relates to a method of manufacturing a semiconductor device provided with a capacitor. The invention further relates to a method of manufacturing a semiconductor device provided with an interconnection pattern. The present invention still further relates to an apparatus for manufacturing such semiconductor devices.

2. Description of the Background Art

Dynamic Random Access Memories (hereinafter referred to as DRAM) can be classified into several types according to the capacitor structure. One example of the capacitor, a stacked type capacitor, can easily secure a sufficient capacitance even if device elements are miniaturized as a semiconductor device has been highly integrated, since the structure of the stacked type capacitor increases opposing areas of capacitor electrodes. Accordingly, the stacked type capacitor has been widely utilized with higher integration of a semiconductor device.

Figure 12:
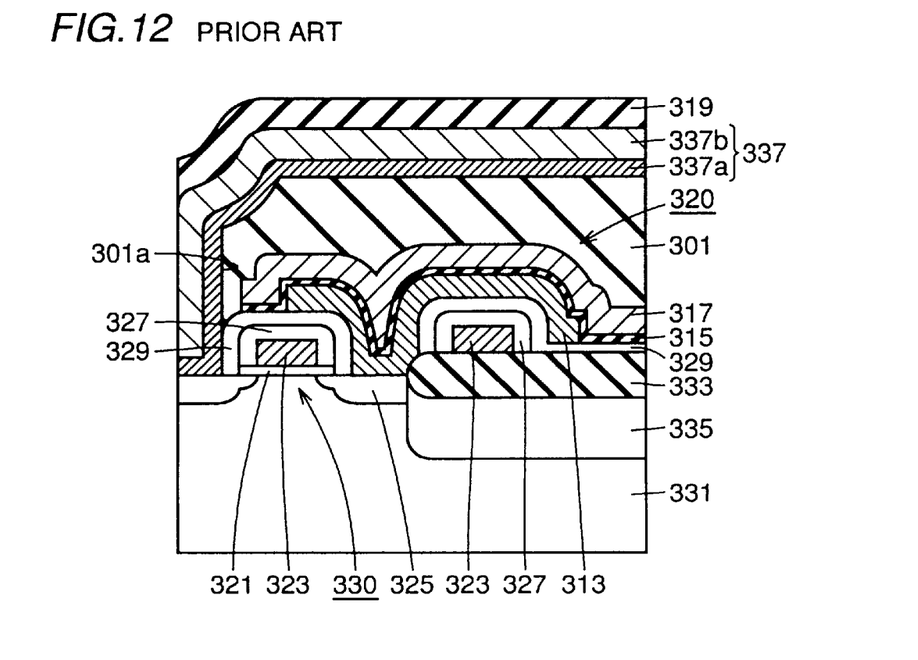
FIG. 12 is a cross sectional view of a DRAM provided with a conventional stacked type capacitor.

FIG. 12 is a cross sectional view of a DRAM provided with a conventional stacked type capacitor (hereinafter referred to as first conventional example). With reference to FIG. 12, an isolation oxide film 333 for electrically isolating element regions from each other is formed at a surface of a silicon substrate 331. Under isolation oxide film 333, a channel stopper region 335 is provided. A memory cell of a DRAM is formed at an element region of silicon substrate 331. The memory cell includes one transfer gate transistor 330 and one capacitor 320.

An interlayer insulating film 301 is formed over the entire surface of silicon substrate 331 to cover capacitor 320. A contact hole 301a is provided in interlayer insulating film 301 for exposing a surface of one source/drain region 325. At the one source/drain region 325, a bit line 337 is formed through contact hole 301a. Bit line 337 is formed of a polycrystalline silicon 337a and a tungsten silicide layer 337b. An insulating film 319 is formed over silicon substrate 331 to cover bit line 337.

A problem in the semiconductor memory device shown in FIG. 12 is that patterning in the lithography step is difficult due to a level difference.

Figure 13:
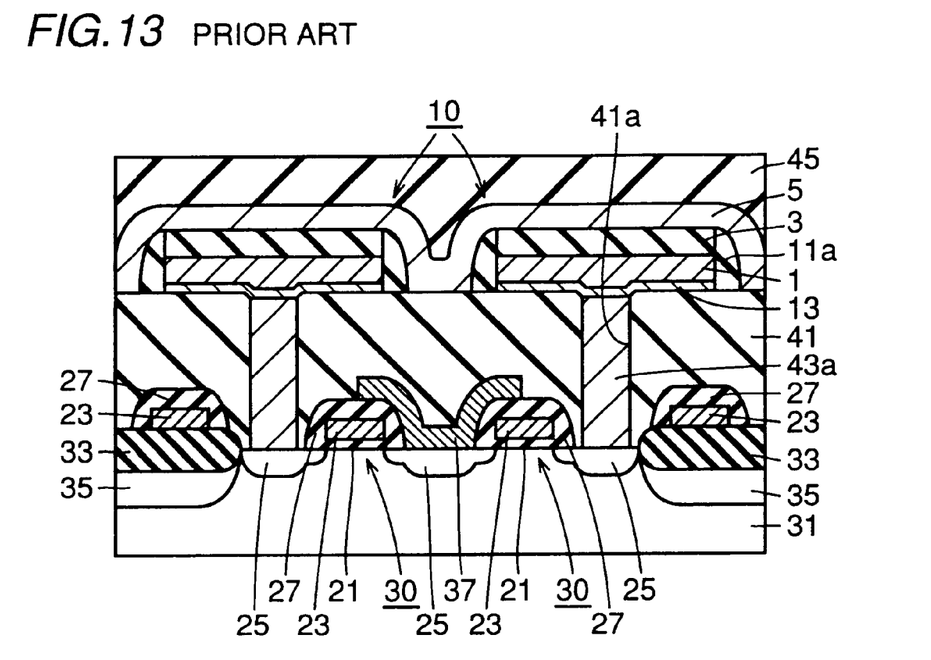
FIG. 13 is a cross sectional view of a DRAM provided with another conventional stacked type capacitor.

A semiconductor memory device illustrated in FIG. 13 is thus proposed in order to solve such a problem.

Referring to FIG. 13, an isolation oxide film 33 is provided at a surface of a silicon substrate 31. A channel stopper region 35 is formed contacting with the lower surface of isolation oxide film 33. A plurality of transfer gate transistors 30 are formed at an element region of silicon substrate 31.

Transfer gate transistor 30 includes a gate oxide film 21, a gate electrode 23, and a pair of source/drain regions 25. An insulating film 27 is formed over silicon substrate 31 to cover a surface of gate electrode 23.

A bit line 37 is connected to one source/drain region 25. An interlayer insulating film 41 is provided over silicon substrate 31 to cover bit line 37 and transfer gate transistors 30.

A contact hole 41a is formed in interlayer insulating film 41 for exposing the other source/drain region 25. A plug layer 43a formed of doped polysilicon, filling contact hole 41a and connected to the other source/drain region 25, is provided on silicon substrate 31. A barrier layer 13 has a triple layer structure including titanium/titanium nitride/titanium. A capacitor 10 is connected to plug layer 43a with barrier layer 13 interposed.

Capacitor 10 is provided with a lower electrode layer 1, a capacitor insulating layer 3 and an upper electrode layer 5.

Barrier layer 13 prevents diffusion of impurities from plug layer 43a formed of doped polysilicon toward lower electrode layer 1, and improves adhesion between interlayer insulating film 41 and lower electrode layer 1.

Lower electrode layer 1 is deposited on a surface of interlayer insulating film 41 to a film thickness of 500 to 700 Å with barrier layer 13 interposed. Lower electrode layer 1 is formed of platinum. On a surface of lower electrode layer 1, capacitor insulating layer 3 formed of highly dielectric material such as tantalum oxide ($Ta_2O_5$), plumbous-zirconate-titanate (PZT), plumbous-lanthanum-zirconate-titanate (PLZT), strontium titanic oxide (STO), or barium titanic oxide (BTO) is formed.

PZT and PLZT have the maximum relative dielectric constant when formed on platinum. Therefore, lower electrode layer 1 is preferably formed of platinum.

A sidewall spacer 11a is formed on interlayer insulating film 41 to cover sidewalls of lower electrode layer 1 and capacitor insulating layer 3. Sidewall spacer 11a provides dielectric isolation between lower electrode 1 and upper electrode 5 described below. Upper electrode layer 5 is formed to cover lower electrode layer 1 with capacitor insulating layer 3 and sidewall spacer 11a interposed, thus providing capacitor 10. Upper electrode layer 5 is formed of platinum, doped polysilicon or the like. An insulating film 45 is formed over silicon substrate 31 to cover capacitor 10.

Although the semiconductor device shown in FIG. 13 does not have the problem found in the first conventional example, it has another problem.

The problem will be pointed out in the description of the manufacturing method of the semiconductor device (FIGS. 14 to 23).

Figure 14:
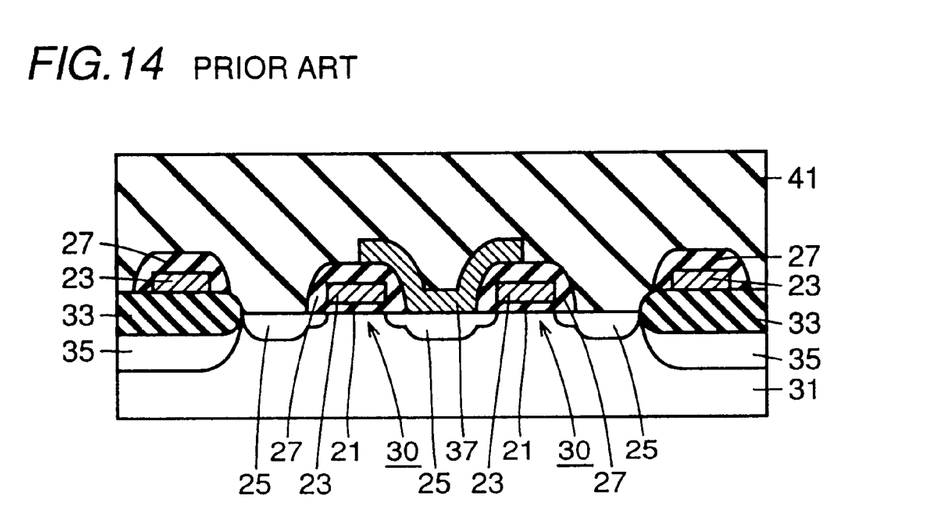
FIGS. 14–23 are cross sections of a semiconductor device in the first to the tenth steps of a method of manufacturing a conventional semiconductor device.

Referring to FIG. 14, transfer gate transistor 30 having gate oxide film 21, gate electrode 23 and a pair of source/drain regions 25 is provided on silicon substrate 31. Insulating film 27 covers an outer surface of gate electrode 23. Bit line 37 connected to one source/drain region 25 is formed over silicon substrate 31. Bit line 37 is formed, for example, of doped polysilicon.

A silicon oxide film to be interlayer insulating film 41 is formed by low pressure CVD (Chemical Vapor Deposition) over silicon substrate 31 to cover bit line 37 and transfer gate transistor 30. SOG film (not shown) is applied to a surface of the silicon oxide film in order to planarize the surface. Interlayer insulating film 41 having almost planar surface is provided by etching back the SOG film and the silicon oxide film.

Figure 15:
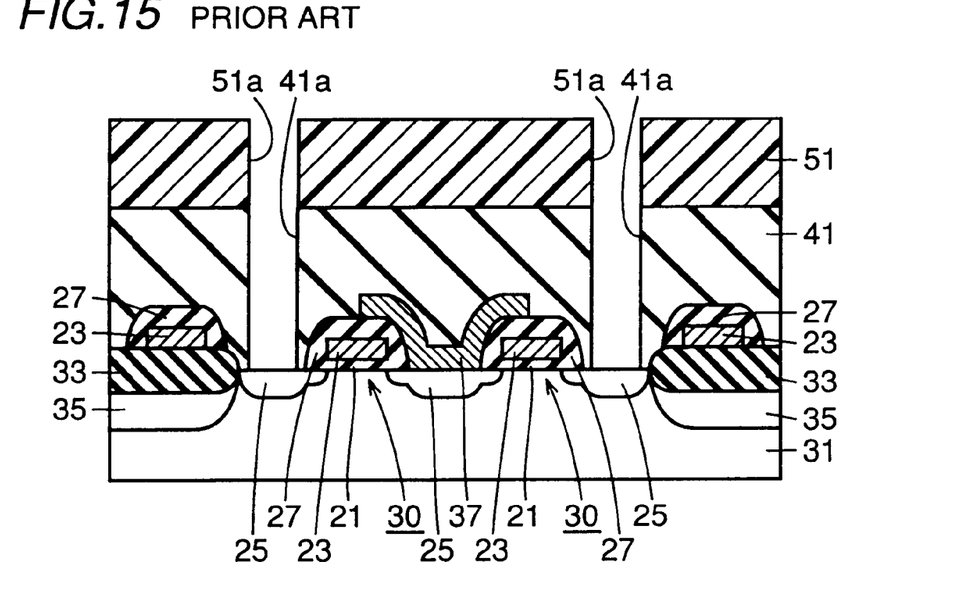

With reference to FIG. 15, a resist pattern 51 having an aperture 51a over one source/drain region 25 is formed on interlayer insulating film 41. Interlayer insulating film 41 is anisotropically etched using resist pattern 51 as a mask. Contact hole 41a for exposing the surface of one source/drain region 25 is formed in interlayer insulating film 41 through etching. Resist pattern 51 is thereafter removed.

Figure 16:
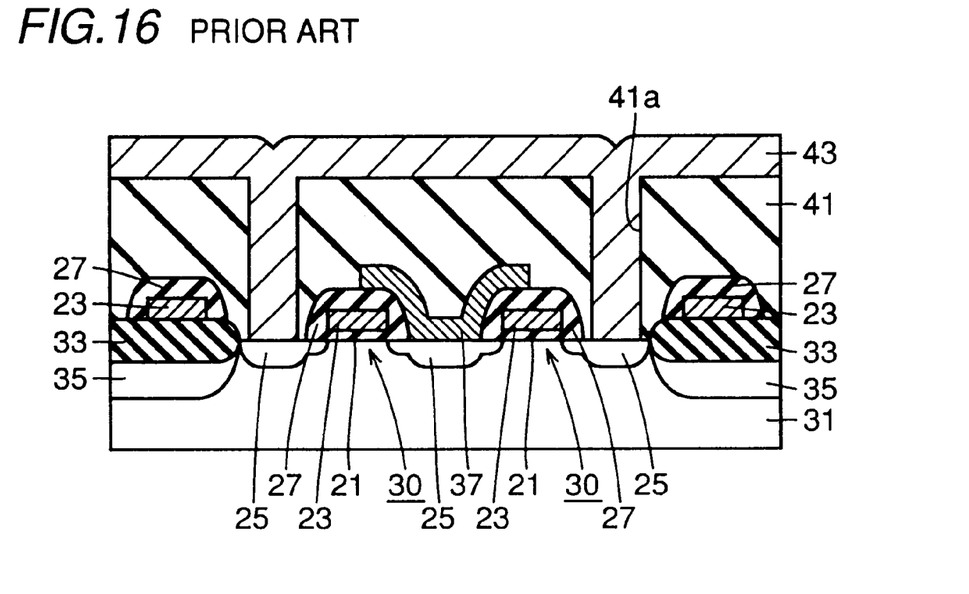

Referring to FIG. 16, a doped polysilicon film 43 filling contact hole 41a and contacting one source/drain region 25 is formed over silicon substrate 31. Doped polysilicon film 43 is formed by CVD method to a film thickness of 3000 to 9000 Å.

Figure 17:
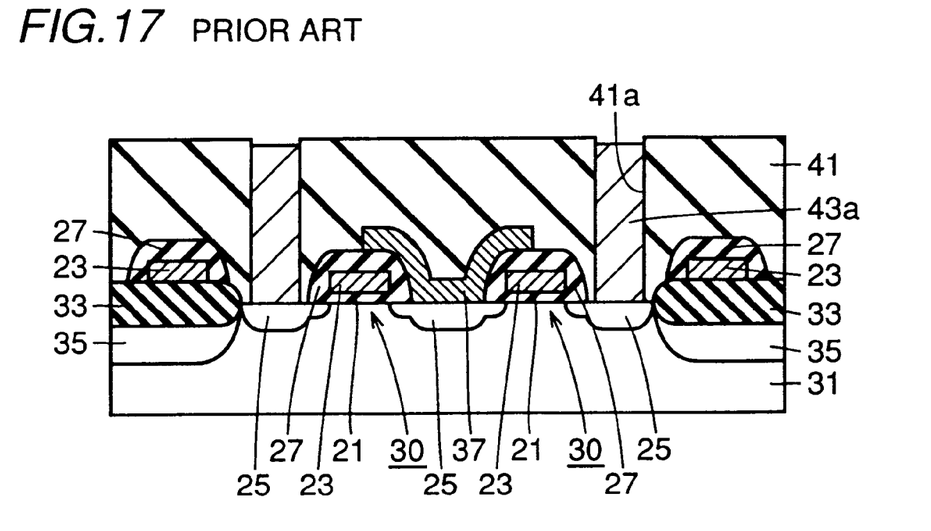

With reference to FIGS. 16 and 17, doped polysilicon film 43 is etched back until at least the surface of interlayer insulating film 41 is exposed. Plug layer 43a filling contact hole 41a and electrically connected to the surface of one source/drain region 25 is provided through this etch back.

Figure 18:
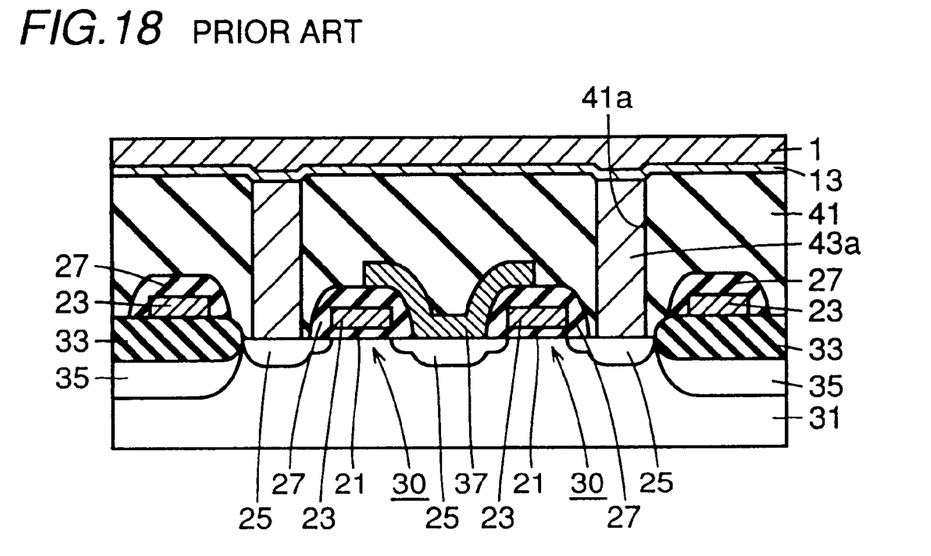

Referring to FIG. 18, barrier layer 13 in contact with the surface of plug layer 43a is formed on the surface of interlayer insulating film 41. Barrier layer 13 is formed of triple layers of titanium, titanium nitride and titanium, and each layer is generated one after the other by sputtering method to the thickness of approximately 100 Å. In order to cause reaction between the lowest titanium layer with interlayer insulating film 41 and produce silicide, they are thermally processed in an ambient of nitrogen or argon with a temperature of 650° C. for 20 minutes. A platinum layer 1 is deposited to a film thickness of 500 to 700 Å on barrier layer 13 by CVD. In order to alloy the highest titanium layer constituting barrier layer 13 with the platinum in platinum layer 1, they are thermally processed in an ambient of nitrogen or argon with a temperature of 650° C. for 20 minutes.

Figure 19:
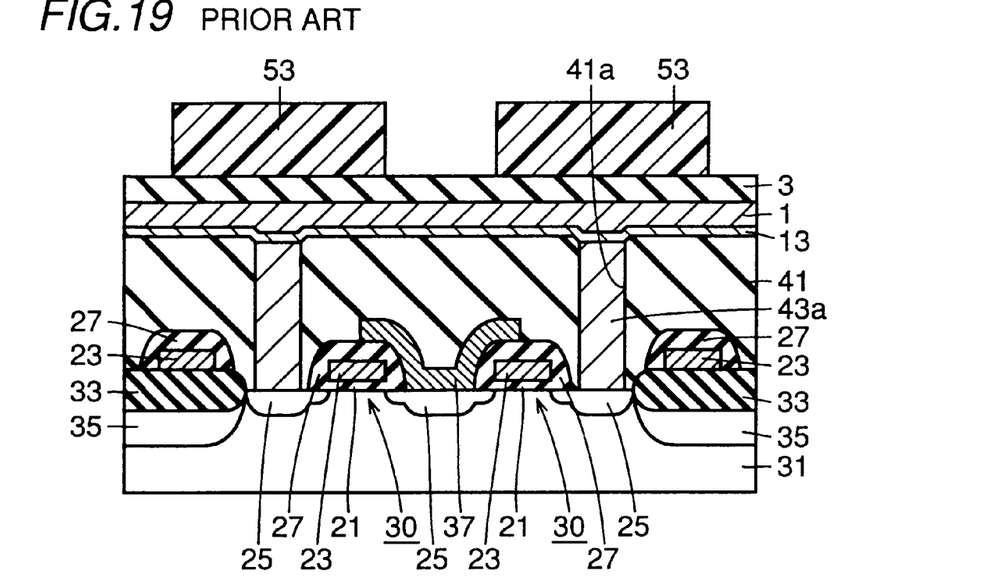

With reference to FIG. 19, a highly dielectric material layer 3 formed of highly dielectric material such as PZT is provided on platinum layer 1. If the highly dielectric material is PZT, highly dielectric material layer 3 is deposited to a film thickness of 1000 to 2000 Å.

A resist pattern 53 patterned to a desired shape is then formed on the surface of highly dielectric material layer 3.

Figure 20:
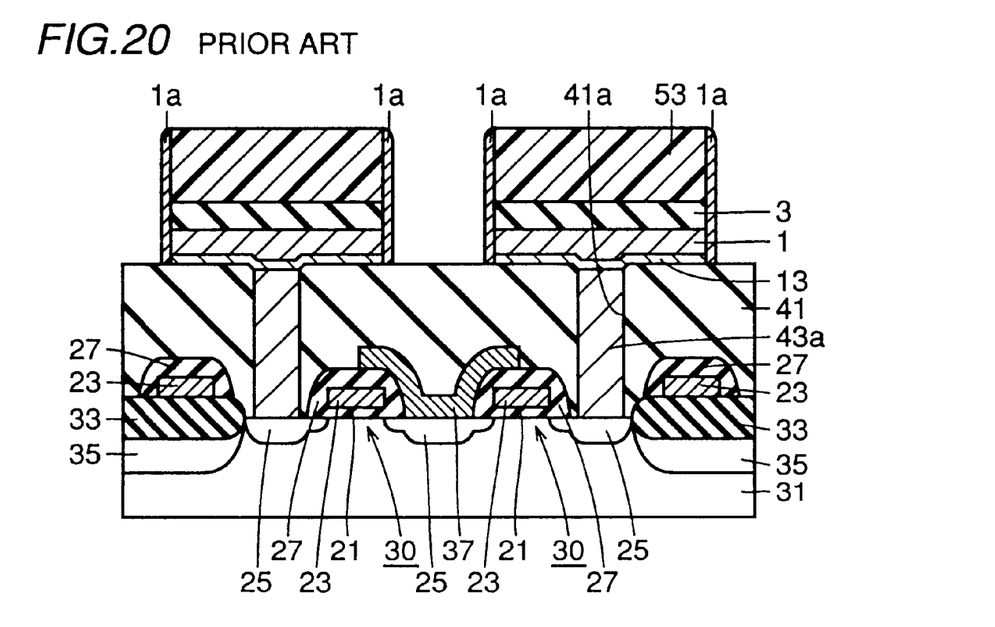

Referring to FIGS. 19 and 20, highly dielectric material layer 3, platinum layer 1 and barrier layer 13 are successively anisotropically etched using resist pattern 53 as a mask.

Figure 21:
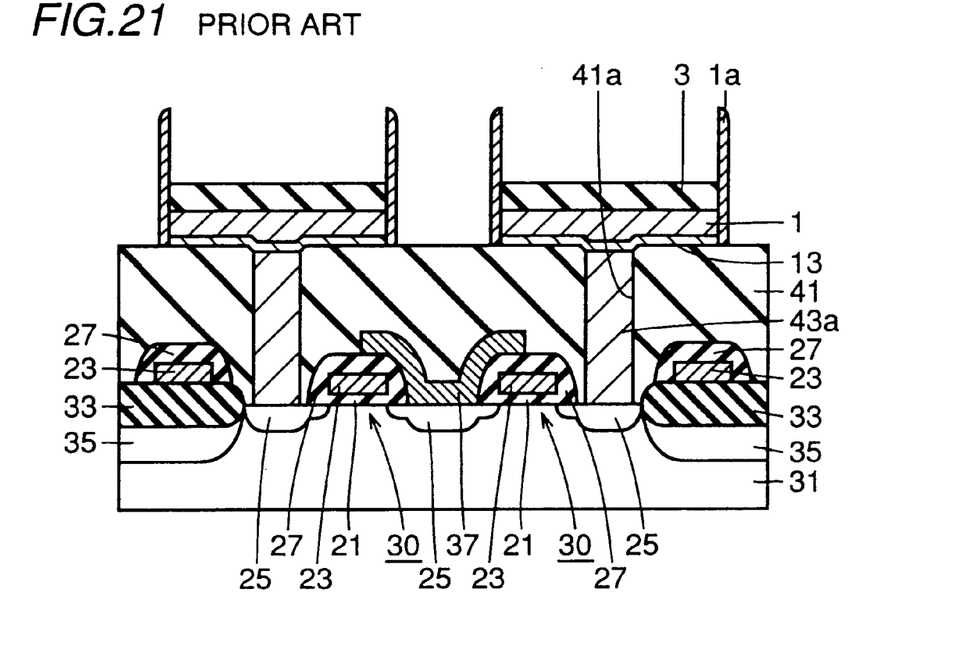

A problem found in this step will be described. When the platinum in lower electrode layer 1 is etched, the platinum once removed by etching could attach to sidewalls of lower electrode layer 1, capacitor insulating layer 3 and resist pattern 53 as shown in FIG. 20. With reference to FIGS. 20 and 21, an etching residue 1a contacting the sidewall of lower electrode layer 1 and extending upward is left after resist pattern 53 is removed.

Figure 22:
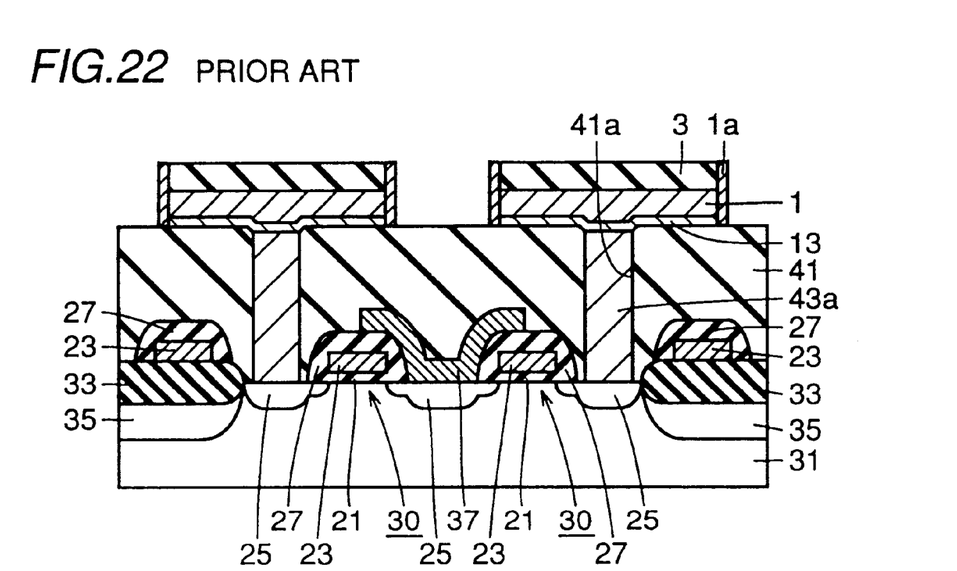
Figure 23:
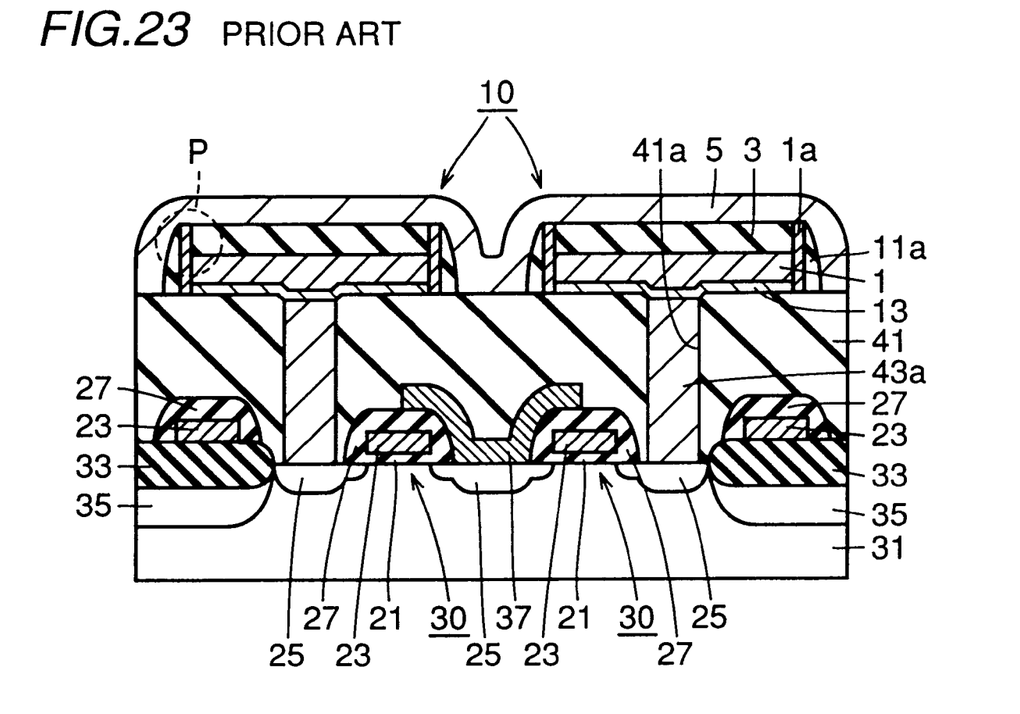

Referring to FIGS. 21 and 22, in the step of removing etching residue 1a by a physical and mechanical method, only the portion of etching residue 1a extending upward from the surface of capacitor insulating layer 3 is removed, and the portion of etching residue 1a below that remains connected to the sidewall of lower electrode layer 1. Referring to FIG. 23, spacer 11a is formed with etching residue 1a left there, then upper electrode layer 5 is formed and capacitor 10 is completed.

Upper electrode layer 5 is formed with remaining etching residue 1a, so that lower electrode layer 1 and upper electrode layer 5 are electrically connected through the remaining etching residue 1a. In spite of the presence of spacer 11a for electrically isolating upper electrode layer 5 and lower electrode layer 1, they are electrically connected with each other. The semiconductor device shown in FIG. 13 having a desired structure (i.e., not having etching residue 1a) cannot be practically obtained. In this case, the function of the capacitor 10 cannot be maintained, and storage and erase operation of a memory cell is impossible.

If etching residue 1a is removed using aqua regia, lower electrode layer 1 would be melted away, causing another problem.

SUMMARY OF THE INVENTION

One object of the present invention is to provide a method of manufacturing an improved semiconductor device having a capacitor in which etching residue is effectively removed in order to maintain the function of the capacitor.

Another object of the present invention is to provide a method of manufacturing an improved semiconductor device including an interconnection pattern in which etching residue formed on the sidewall of the interconnection pattern is effectively removed when the interconnection pattern formed of refractory metal is produced by dry etching method.

Still another object of the present invention is to provide an apparatus for manufacturing a semiconductor device in which such manufacturing methods of a semiconductor device can be implemented.

A method of manufacturing a semiconductor device according to the first aspect of the invention is related to a manufacturing method of a semiconductor device having a capacitor. A refractory metal layer formed of a refractory metal is formed on a substrate. A resist pattern is provided on the refractory metal layer. The refractory metal layer undergoes dry etching using the resist pattern as a mask, thereby producing a first electrode pattern formed of refractory metal. The resist pattern is then removed. A sidewall of the first electrode pattern is cleaned using aqueous solution of surface active agent. A highly dielectric film formed of highly dielectric material is provided over the substrate to cover the first electrode pattern. A second electrode pattern is formed to cover the first electrode pattern with the highly dielectric film interposed.

Preferably, cationic surface active agent, anionic surface active agent, amphoteric surface active agent, or nonionic surface active agent is used as the surface active agent described above.

One example of the cationic surface active agent is quaternary ammonium salt represented by the following general formula (where $R_1$ to $R_3$ are alkyl group with a carbon number of 1 to 4, $R_4$ is alkyl group or alkenyl group with a carbon number of 6 to 18. X is inorganic acid group, organic acid group or halogen.)

The anionic surface active agent can be salt of saturated or unsaturated fatty acid, salt of long-chain alcohol sulfate ester, alkyl sulfonate, salt of alkyl phosphoric ester, or the like. The amphoteric surface active agent can be betaine or the like. The nonionic surface active agent can be polyoxyethylene alkyl ether, polyoxyethylene alkyl phenyl ether, polyoxyethylene alkyl amido, polyoxyethylene-polyoxypropylene glycol, polyoxyethylene fatty acid ester, or the like. Other than above surface active agents, fluorine type surface active agent may be utilized. The nonionic surface active agent is most preferable among those agents.

One kind of surface active agent may be used, or two or more of these may be mixed. The concentration of the surface active agent for use is 0.001 to 5 percentage by weight, and preferably 0.005 to 3 percentage by weight. If the concentration of the surface active agent is 0.001 percentage by weight or less, the rate of removing etching residue is undesirably low, and even if the concentration is 5 percentage by weight or more, the removing rate is not improved, and economically preferable result cannot be obtained.

A method of manufacturing a semiconductor device according to the second aspect of the invention is related to a manufacturing method of a semiconductor device including an interconnection pattern. A refractory metal layer formed of refractory metal is provided on a substrate. A resist pattern is formed on the refractory metal layer. The refractory metal layer undergoes dry etching using the resist pattern as a mask, then an interconnection pattern formed of refractory metal is provided. The resist pattern is then removed. A sidewall of the interconnection pattern is cleaned using aqueous solution of surface active agent.

An apparatus for manufacturing a semiconductor device according to the third aspect of the present invention is provided with a cleaning tank containing aqueous solution of surface active agent. The apparatus has a wafer transport unit for carrying a wafer within the cleaning tank. The apparatus further has a wafer vibration unit which vibrates the wafer within the cleaning tank.

In the method of manufacturing a semiconductor device having a capacitor according to the first aspect of the invention, etching residue formed on the surface of the sidewall of the first electrode pattern is removed by cleaning the sidewall of the first electrode pattern using cleaning agent containing surface active agent. Although the mechanism has not been ascertained, it is considered that surface tension and dispersion force of the cleaning agent can be decreased owing to micelle effect of the surface active agent, thereby weakening adhesion between the sidewall surface of the first electrode pattern and the etching residue as well as bonding force among components constituting the etching residue.

If ultrasonic wave is simultaneously used when the sidewall of the first electrode pattern is cleaned using aqueous solution containing surface active agent, the etching residue which is now more easily removable owing to the micelle effect of the surface active agent is physically vibrated and then easily peeled off from the sidewall surface of the first electrode pattern. The ultrasonic wave further separates cluster of molecules of chemical liquid and promotes complex formation reaction. Accordingly, the adhesion of the etching residue and the bonding force among components constituting the etching residue are further weakened.

The mechanism described above can be applied to the method of manufacturing a semiconductor memory device including an interconnection pattern according to the second aspect of the invention.

In the apparatus for manufacturing a semiconductor device according to the third aspect of the invention, the entire wafer surface can be equally cleaned without nonuniformity resulted from the cleaning, as the wafer vibration unit which vibrates the wafer in the cleaning tank is utilized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described referring to the drawings.

FIGS. 1 through 6 are cross sections of a semiconductor device in the respective manufacturing steps of the semiconductor device including a capacitor according to the embodiment of the present invention. It is noted that FIGS. 1–5 illustrate the main portions of the completed device shown in FIG. 6.

The steps of manufacturing the semiconductor device prior to the step of forming a capacitor are similar to those described in relation to the conventional example, and therefore, their description will not be repeated.

Figure 1:
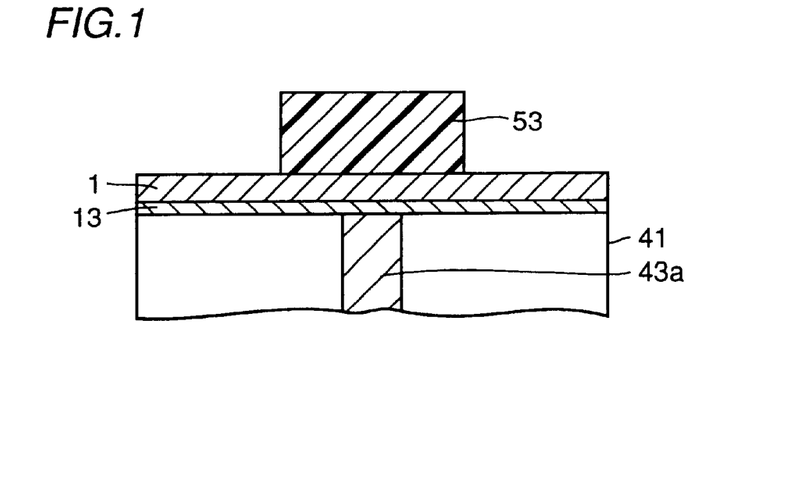
FIGS. 1–6 are cross sections of a semiconductor device in the first to the sixth steps of a method of manufacturing a semiconductor device according to the embodiment of the present invention.

Referring to FIG. 1, barrier layer 13 formed of refractory metal in contact with plug layer 43a is provided on interlayer insulating film 41. Lower electrode layer 1 is formed on barrier layer 13. Material such as titanium, titanium nitride, or titanium oxide is used for barrier layer 13. As the material for lower electrode layer 1, platinum, platinum alloy, ruthenium, ruthenium oxide, iridium, iridium oxide, or nickel alloy is utilized. Resist pattern 53 having a prescribed shape is formed on lower electrode layer 1.

Figure 2:
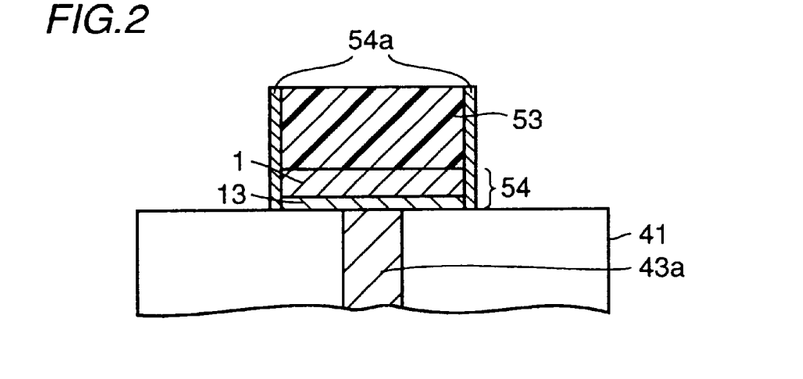

With reference to FIGS. 1 and 2, lower electrode layer 1 and barrier layer 13 are anisotropically etched by dry etching method using resist pattern 53 as a mask. A first electrode pattern 54 formed of lower electrode layer 1 and barrier layer 13 is thus formed. At this time, an etching residue 54a is formed on sidewalls of first electrode pattern 54 and resist pattern 53. Etching residue 54a is produced from refractory metal, organic component of resist pattern 53, etching gas and reaction product complicatedly mixed with each other.

Figure 3:
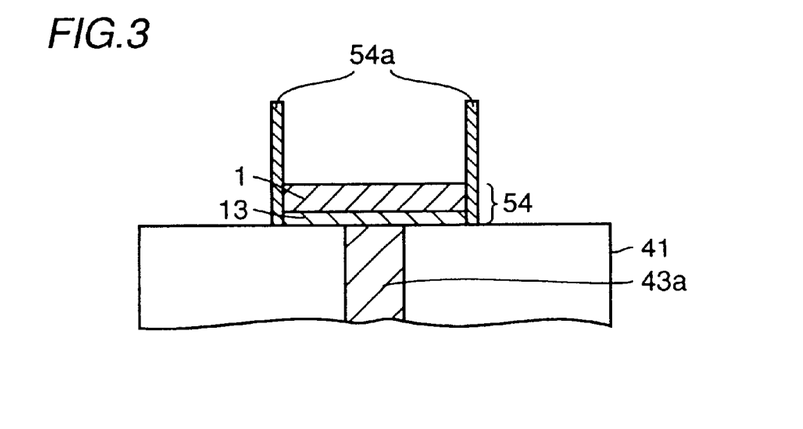

Referring to FIGS. 2 and 3, resist pattern 53 is removed through a method such as ashing.

Figure 4:
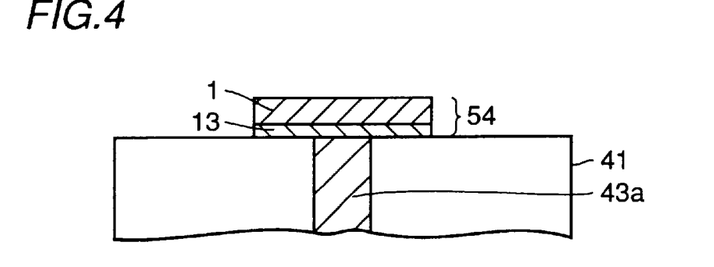

With reference to FIGS. 3 and 4, etching residue 54a attached to the sidewall of first electrode pattern 54 is cleaned using aqueous solution of surface active agent and removed.

The result of cleaning under various conditions using platinum as refractory metal is shown in Table 1 below.

TABLE 1

| experiment No. | composition of cleaning solution (aqueous solution) | processing condition | ultrasonic wave | removability |
|---|---|---|---|---|
| 1 | HIGH TENOL 12 200 ppm | 23° C. 10 min. | US dip | ○ |
| 2 | NEUGEN EA 130A 500 ppm | 23° C. 10 min. | US dip | ◎ |
| 3 | AMEET 320 500 ppm | 23° C. 10 min. | US dip | ○ |
| 4 | ARCARDE FC-95 100 ppm | 23° C. 10 min. | US dip | ○ |
| 5 | TMAH 1.0% | 23° C. 10 min. | US dip | no change |
| 6 | acetic acid 2.0% N,N-dimethylacetamide 40% | 23° C. 10 min. | US dip | X |
| 7 | acetonitrile 45% | 23° C. 10 min. | US dip | Δ |
| 8 | 1,4 dioxane 45% | 23° C. 10 min. | US dip | Δ |
| 9 | pyridine 45% | 23° C. 10 min. | US dip | Δ |
| 10 | acetic acid 5% hydrogen peroxide 15.5% | 23° C. 10 min. | US dip | Δ |

◎: no residue, ○: least amount of residue, Δ: small amount of residue, X: large amount of residue
"US dipp38 shown in the table above represents that cleaning is done according to immersion cleaning using ultrasonic wave simultaneously. TMAH represents tetramethyl ammonium hydroxide.

The effect of removal of etching residue 54a was evaluated using a scanning electron microscope (SEM). In experiment No. 1, aqueous solution containing 200 ppm of trade name High Tenol 12 (registered trademark.Dai-ichi Kogyo Seiyaku Co., Ltd.) which is an anionic surface active agent is used. In experiment No. 2, aqueous solution containing 500 ppm of trade name Neugen EA 130A (registered trade mark.Dai-ichi Kogyo Seiyaku Co., Ltd.) which is a nonionic surface active agent is used. In experiment No. 3, aqueous solution containing trade name Ameet 320 (registered trade mark.Kao Corporation) which is a nonionic surface active agent is used. In experiment No. 4, aqueous solution containing 100 ppm of trade name Arcarde FC-95 (registered trade mark.SUMITOMO 3M LTD.) which is a fluorine type surface active agent is used.

Experiment Nos. 1–4 are the embodiments of the present invention, and experiment Nos. 5–10 are the comparative examples.

Table 1 clearly indicates that the aqueous solutions containing surface active agents used in experiment Nos. 1–4 provide an excellent removal effect.

Figure 5:
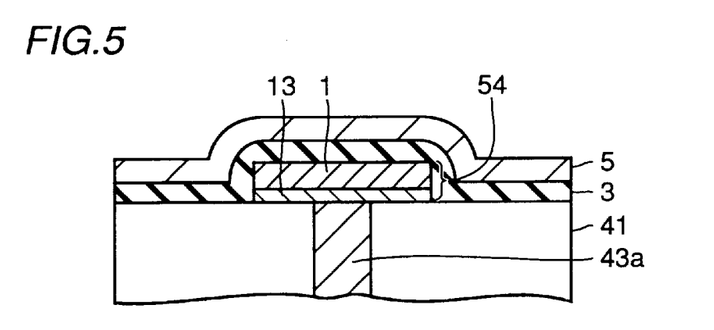

With reference to FIG. 5, highly dielectric film 3 formed of highly dielectric material is provided over interlayer insulating film 41 to cover first electrode pattern 54. Second electrode pattern 5 is formed to cover first electrode pattern 54 with highly dielectric film 3 interposed.

Figure 6:
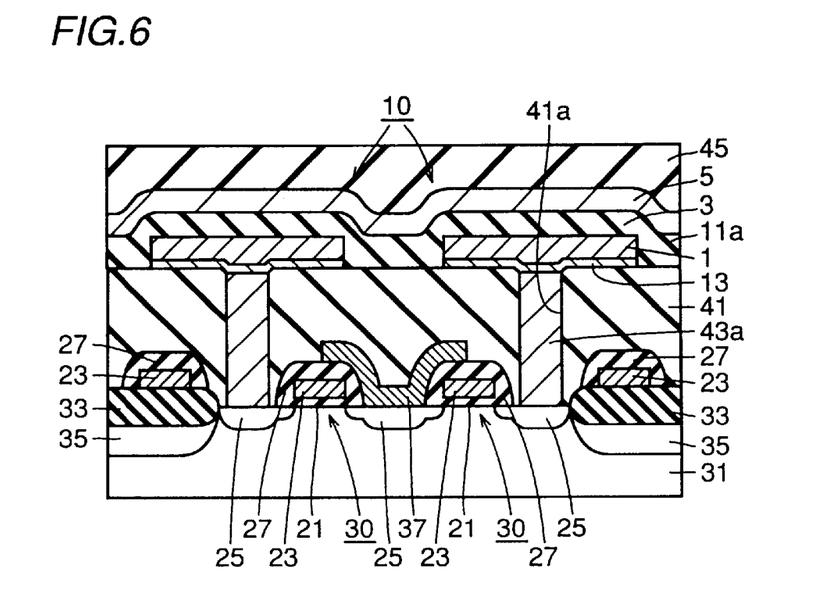

With reference to FIG. 6, an insulating film 45 is provided over silicon substrate 31 and a semiconductor memory device including a capacitor is completed.

Although the cleaning is conducted after forming the lower electrode of the capacitor in the embodiment described above, the present invention is not limited to this example. Specifically, if the present invention is applied when an interconnection pattern is formed of refractory metal, the etching residue can be effectively cleaned from the sidewall of the interconnection pattern.

The temperature of cleaning liquid and the time of cleaning are appropriately selected according to the state of etching residue and the kind of refractory metal.

As for the method of cleaning, immersion cleaning based on batch process, spray cleaning based on single wafer process system, or immersion cleaning simultaneously using ultrasonic wave is employed.

[Embodiments]

First Embodiment

Figure 7:
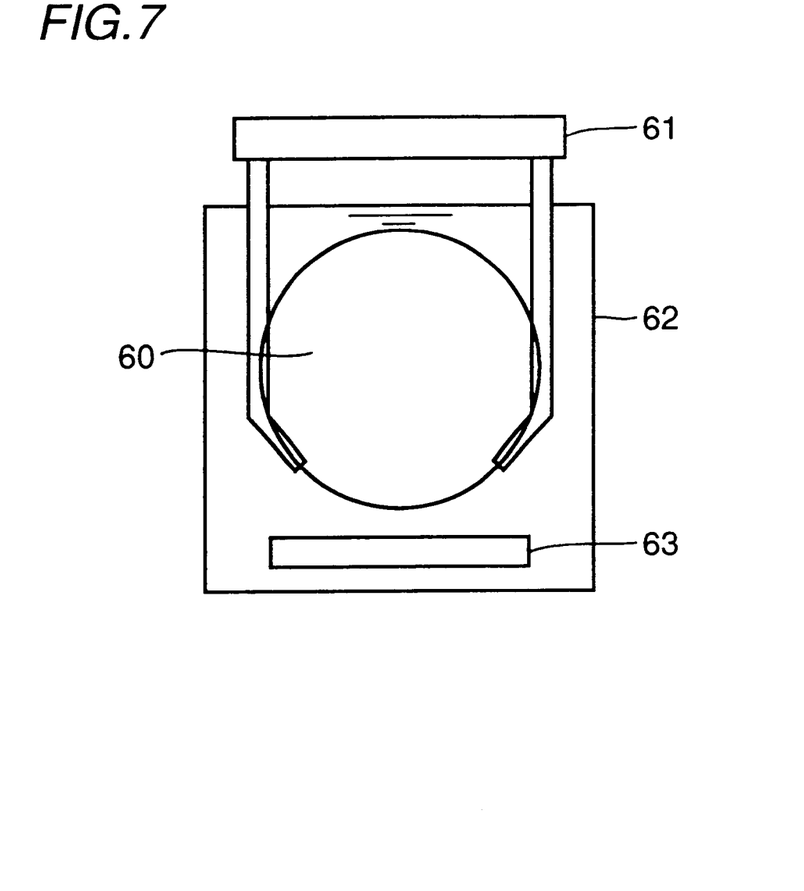
FIG. 7 is an illustration showing a concept of an apparatus for manufacturing a semiconductor device according to the first embodiment.

FIG. 7 is an illustration showing a concept of a cleaning equipment employing immersion cleaning method simultaneously using ultrasonic wave. The operation of cleaning is as follows. A wafer 60 secured by a wafer transport arm 61 is immersed in a cleaning tank 62 containing aqueous solution of surface active agent. Ultrasonic wave is provided from an ultrasonic wave generator 63 placed at a lower part or a side part of cleaning tank 62. Frequency of the ultrasonic wave is preferably at least 800 kHz. If the frequency is below 800 kHz, the semiconductor device could be damaged and the effect of the cleaning would be low.

Figure 8:
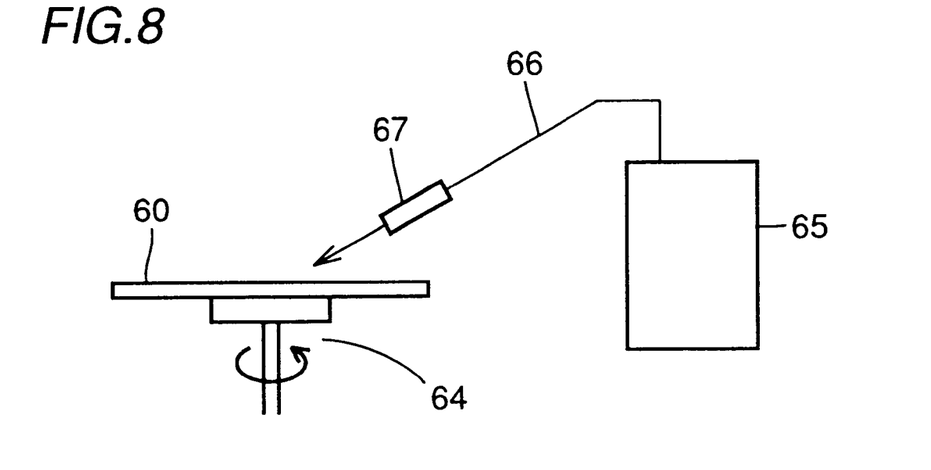
FIG. 8 is an illustration showing a concept of another apparatus for manufacturing a semiconductor device according to the first embodiment.

FIG. 8 is an illustration showing a concept of a cleaning equipment employing the spray cleaning method according to single wafer process system. Wafer 60 is fixed on a wafer rotary stage 64 by vacuum adsorption with its surface to be cleaned facing upward, then rotated. Aqueous solution of surface active agent is provided to a supply tank 65 and pressurized. The cleaning solution is sprayed over the surface of wafer 60 from a spray nozzle 67 through a pipe 66.

Second Embodiment

Figure 9:
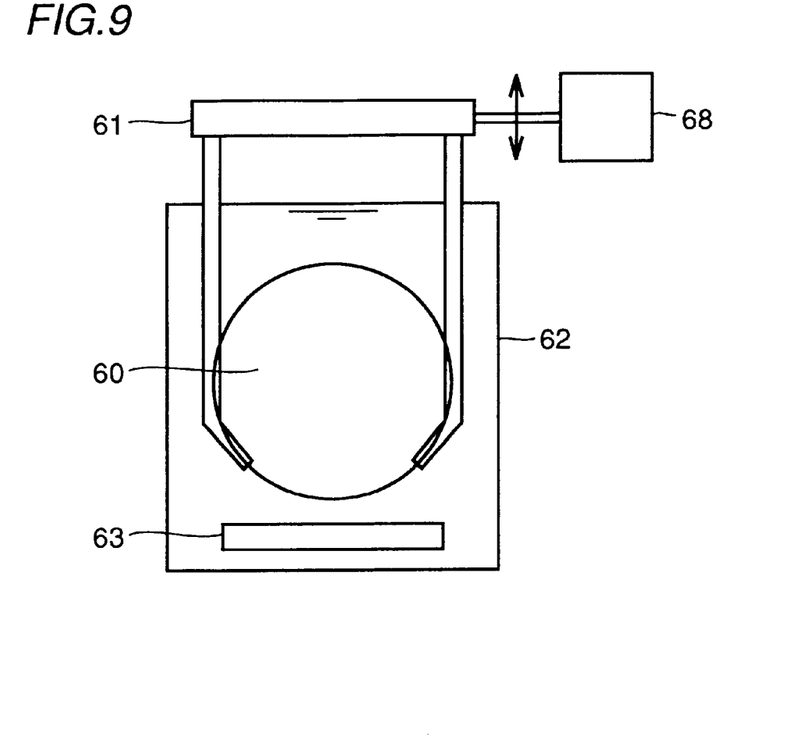
FIG. 9 is an illustration showing a concept of an apparatus for manufacturing a semiconductor device according to the second embodiment.

FIG. 9 is an illustration showing a concept of an apparatus for manufacturing a semiconductor device according to the second embodiment.

The apparatus is provided with cleaning tank 62 containing aqueous solution of surface active agent. Ultrasonic wave generator 63 is placed at the lower part of cleaning tank 62. The apparatus has wafer transport arm 61 which carries wafer 60. A wafer vibration unit 68 which vibrates wafer 60 in upward and downward direction is placed at wafer transport arm 61.

The operation is as follows. Wafer 60 is carried by wafer transport arm 61 and immersed in cleaning tank 62 filled with aqueous solution of surface active agent. Ultrasonic wave is provided from ultrasonic wave generator 63 placed at the lower part of cleaning tank 62. Wafer 60 is further vibrated upwardly and downwardly by wafer vibration unit 68. The vibration of wafer 60 prevents the nonuniformity of cleaning due to the standing wave of the ultrasonic wave produced in cleaning tank 62. The entire surface of wafer 60 is accordingly uniformly cleaned.

The interval of the standing wave of the ultrasonic wave (resonance wavelength) is determined by the frequency of the ultrasonic wave and the sound velocity of the cleaning solution. If the frequency of the ultrasonic wave is 900 kHz and the sound velocity of the cleaning solution is 150 m/sec, the interval of the standing wave would be 0.83 mm, and the portion highly effectively cleaned and the other portion not so effectively cleaned are shaped into stripes. In this case, the amplitude of the vibration of wafer vibration unit 68 for preventing nonuniformity of the cleaning should be at least 0.83 mm. The maximum amplitude of vibration of wafer vibration unit 68 is determined according to the size of cleaning tank 62 (distance from ultrasonic wave generator 63 to the upper surface of cleaning tank 62) and the diameter of wafer 60. Larger cleaning tank 62 is not economically advantageous. Accordingly, the amplitude of vibration of wafer vibration unit 68 is appropriately determined by the frequency of ultrasonic wave and the sound velocity of cleaning solution, as well as the size of cleaning tank 62 and diameter of wafer 60.

Third Embodiment

Figure 10:
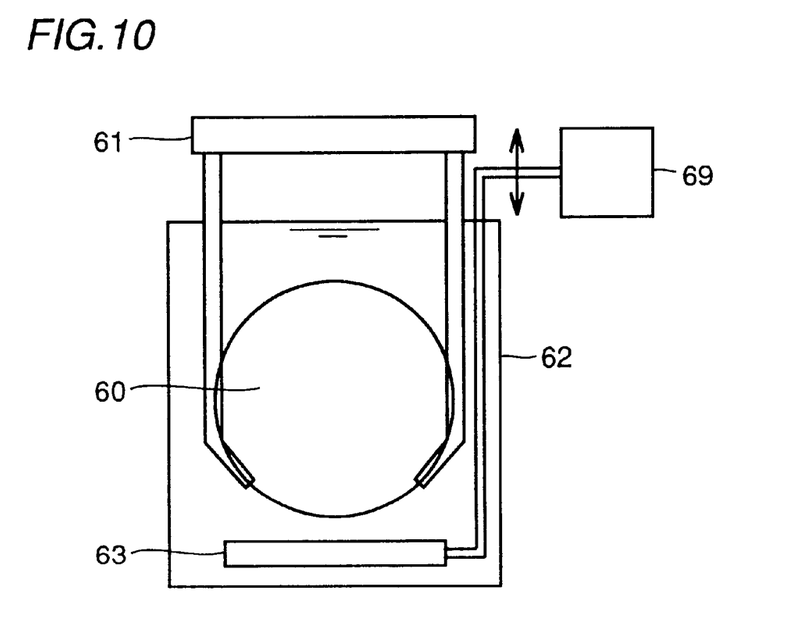
FIG. 10 is an illustration showing a concept of an apparatus for manufacturing a semiconductor device according to the third embodiment.

FIG. 10 is a an illustration showing a concept of an apparatus for manufacturing a semiconductor device according to the third embodiment. The apparatus according to the third embodiment is provided with a generator vibration unit 69 which vibrates ultrasonic wave generator 63 upward and downward.

The operation is as follows. Wafer 60 is carried by wafer transport arm 61 and immersed within cleaning tank 62 filled with aqueous solution of surface active agent. Ultrasonic wave is supplied from ultrasonic wave generator 63 placed at the lower part of cleaning tank 62. Ultrasonic wave generator 63 is vibrated in upward and downward directions by generator vibration unit 69 connected to ultrasonic wave generator 63. The upward and downward vibration of ultrasonic wave generator 63 prevents nonuniformity of cleaning due to the standing wave of ultrasonic wave generated within cleaning tank 62, thereby uniformly cleaning the entire surface of wafer 60. The amplitude of vibration of generator vibration unit 69 is appropriately determined according to the frequency of ultrasonic wave and the sound velocity of cleaning solution as well as the size of cleaning tank 62 and the diameter of the wafer 60 as that of wafer vibration unit 68 according to the second embodiment.

Fourth Embodiment

Figure 11:
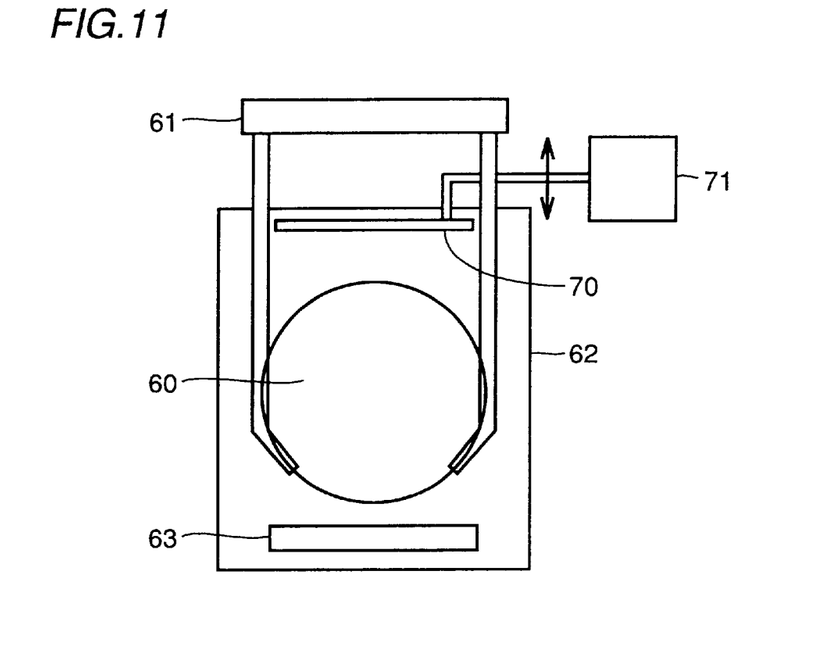
FIG. 11 is an illustration showing a concept of an apparatus for manufacturing a semiconductor device according to the fourth embodiment.

FIG. 11 is an illustration showing a concept of an apparatus for manufacturing a semiconductor device according to the fourth embodiment.

The apparatus for manufacturing a semiconductor device according to this embodiment is provided with a reflection board 70 which reflects ultrasonic wave and a reflection board vibration unit 71 which vibrates reflection board 70 upward and downward.

The operation is next described. Wafer 60 is carried by wafer transport arm 61 and immersed within cleaning tank 62 filled with aqueous solution of surface active agent. Ultrasonic wave is supplied from ultrasonic wave generator 63 placed at the lower part of cleaning tank 62. Ultrasonic wave reflection board 70 is vibrated upward and downward by reflection board vibration unit 71 so that nonuniformity of cleaning due to the standing wave of the ultrasonic wave generated in cleaning tank 62 is prevented and the entire surface of wafer 60 is uniformly cleaned.

The amplitude of vibration of reflection board vibration unit 71 is appropriately determined based on the frequency of ultrasonic wave and the sound velocity of cleaning solution as well as the size of the cleaning tank 62 and the diameter of wafer 60.

In the semiconductor device and the manufacturing apparatus thereof according to the present invention, the etching residue left on the surface of the sidewall of the first electrode pattern or the interconnection pattern is removed by cleaning the surface of the sidewall of the first electrode pattern or the interconnection pattern using cleaning solution containing surface active agent. As a result, when a semiconductor device is fabricated forming a lower electrode layer of a capacitor from refractory metal, the conventional problem can be avoided, that is, the lower and upper electrode layers of the capacitor are not electrically connected.

If the ultrasonic wave is simultaneously used, the etching residue which is now easily removed owing to micelle effect of the surface active agent is physically vibrated, so that the residue is highly effectively peeled off from the sidewall surface of the first electrode pattern. By adding the wafer vibration unit, generator vibration unit, or reflection board vibration unit for the reflection board of ultrasonic wave to the cleaning equipment, nonuniformity of cleaning due to the standing wave of the ultrasonic wave generated in the cleaning tank is prevented, so that the entire surface of the wafer is uniformly cleaned.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for manufacturing a semiconductor device, comprising:

a cleaning tank;

an aqueous solution of a surface active agent in said cleaning tank;

wafer transport means for carrying a wafer in said cleaning tank;

an ultrasonic wave generator placed in said cleaning tank for generating ultrasonic waves in said cleaning tank;

a reflection board placed in said cleaning tank for reflecting ultrasonic wave generated from said ultrasonic wave generator; and reflection board vibration means for vibrating said reflection board in said cleaning tank.

2. The apparatus for manufacturing a semiconductor device according to claim 1, further including generator vibration means for vibrating said ultrasonic wave generator in said cleaning tank.

3. The apparatus for manufacturing a semiconductor device according to claim 1, wherein the surface active agent comprises at least one of a cationic surface active agent, an anionic surface active agent, a nonionic surface active agent, an amphoteric type surface active agent, and a fluorine type surface active agent.

4. The apparatus for manufacturing a semiconductor device according to claim 3, wherein the concentration of the surface active agent in the aqueous solution is about 0.001 percent to about 5 percent by weight.

5. The apparatus for manufacturing a semiconductor device according to claim 3, wherein the concentration of the surface active agent in the aqueous solution is about 0.005 percent to about 3 percent by weight.

6. The apparatus for manufacturing a semiconductor device according to claim 1, wherein the ultrasonic waves have a frequency of at least 800 kHz.

7. An apparatus for manufacturing a semiconductor device, comprising:

a cleaning tank;

an aqueous solution of a surface active agent in said cleaning tank;

wafer transport means for carrying a wafer in said cleaning tank;

an ultrasonic wave generator placed in said cleaning tank for generating ultrasonic waves in said cleaning tank;

a reflection board placed in said cleaning tank for reflecting ultrasonic wave generated from said ultrasonic wave generator; and wafer vibration means for vibrating said wafer in an upward and downward direction in said cleaning tank;

wherein the ultrasonic waves comprise standing waves having a standing wave interval, and the wafer vibration unit is for vibrating the wafer with an amplitude of vibration equal to or greater than the standing wave interval.

8. An apparatus for manufacturing a semiconductor device, comprising:

a cleaning tank;

an aqueous solution of a surface active agent in said cleaning tank;

wafer transport means for carrying a wafer in said cleaning tank;

an ultrasonic wave generator placed in said cleaning tank for generating ultrasonic waves in said cleaning tank;

reflection board placed in said cleaning tank for reflecting ultrasonic wave generated from said ultrasonic wave generator; and generator vibration means for vibrating said ultrasonic wave generator in said cleaning tank.

* * * * *